(12) United States Patent
Meissl et al.

(10) Patent No.: US 6,951,173 B1
(45) Date of Patent: Oct. 4, 2005

(54) ASSEMBLY AND METHOD FOR TRANSFERRING IMPRINT LITHOGRAPHY TEMPLATES

(75) Inventors: Mario J. Meissl, Austin, TX (US); Byung J. Choi, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 100 days.

(21) Appl. No.: 10/437,476

(22) Filed: May 14, 2003

(51) Int. Cl.[7] .................. B41L 39/00; B29C 53/02; B29C 59/02; G03C 5/00
(52) U.S. Cl. .............. 101/483; 101/130; 396/428; 430/22
(58) Field of Search .............. 101/483, 327, 101/32, 41, 407, 473, 130, 131; 396/428; 430/22, 333; 264/494

(56) References Cited

U.S. PATENT DOCUMENTS

| | | | |
|---|---|---|---|
| 4,070,116 A | 1/1978 | Frosch et al. | |
| 4,512,848 A | 4/1985 | Deckman et al. | |
| 4,610,442 A | 9/1986 | Oku et al. | |
| 4,707,218 A | 11/1987 | Giammarco et al. | |
| 4,724,222 A * | 2/1988 | Feldman | 250/492.2 |
| 4,731,155 A | 3/1988 | Napoli et al. | |
| 4,737,425 A | 4/1988 | Lin et al. | |
| 4,763,886 A * | 8/1988 | Takei | 269/73 |
| 5,028,366 A | 7/1991 | Harakal et al. | |
| 5,151,754 A | 9/1992 | Ishibashi et al. | |
| 5,425,848 A | 6/1995 | Haisma et al. | |
| 5,601,641 A | 2/1997 | Stephens | |
| 5,654,238 A | 8/1997 | Cronin et al. | |
| 5,669,303 A | 9/1997 | Maracas et al. | |
| 5,760,500 A * | 6/1998 | Kondo et al. | 310/12 |
| 5,772,905 A | 6/1998 | Chou | |
| 5,849,209 A | 12/1998 | Kindt-Larsen et al. | |
| 5,849,222 A | 12/1998 | Jen et al. | |
| 5,948,470 A | 9/1999 | Harrison et al. | |
| 6,039,897 A | 3/2000 | Lochhead et al. | |
| 6,180,239 B1 | 1/2001 | Whitesides et al. | |
| 6,274,294 B1 | 8/2001 | Hines | |
| 6,309,580 B1 | 10/2001 | Chou | |
| 6,334,960 B1 | 1/2002 | Willson et al. | |
| 6,391,217 B2 | 5/2002 | Schaffer et al. | |

(Continued)

FOREIGN PATENT DOCUMENTS

JP  02-24848  1/1990

(Continued)

OTHER PUBLICATIONS

Raibert et al., "Hybrid Position/Force Control of Manipulators," Transactions of the ASME, Journal of Dynamic Systems, Measurement and Control, Jun. 1981, pp. 126-133, vol. 102.

(Continued)

*Primary Examiner*—Eugene H. Eickholt
(74) *Attorney, Agent, or Firm*—Kenneth C. Brooks

(57) ABSTRACT

Disclosed is a template transfer assembly and method that features a template transfer substrate, and a template having first and second sides, with the first side facing away from the template transfer substrate and the second side facing the template transfer substrate and having mold pattern formed thereon. Polymerized imprint material is disposed between the second side and the template transfer substrate to fixedly attach the template to the template transfer substrate. The method of transferring an imprint lithography template includes dispensing a selected volume of imprinting fluid onto the template transfer substrate, placing the template upon the selected volume; and converting the imprinting fluid to solid imprint material. The selected volume of imprint material is of sufficient quantity to fixedly attach the template to the template transfer substrate while maintaining a space between the mold and the template transfer substrate.

20 Claims, 12 Drawing Sheets

U.S. PATENT DOCUMENTS

| | | |
|---|---|---|
| 6,482,742 B1 | 11/2002 | Chou |
| 6,517,977 B2 | 2/2003 | Resnick et al. |
| 6,517,995 B1 | 2/2003 | Jacobenson et al. |
| 6,518,189 B1 * | 2/2003 | Chou .................. 438/706 |
| 6,580,172 B2 | 6/2003 | Mancini et al. |
| 6,646,662 B1 | 11/2003 | Nebashi et al. |
| 6,696,220 B2 | 2/2004 | Bailey et al. |
| 6,696,229 B1 * | 2/2004 | Dukler et al. .............. 430/333 |
| 6,713,238 B1 | 3/2004 | Chou et al. |
| 6,716,754 B2 | 4/2004 | Hofmann et al. |
| 6,776,094 B1 | 8/2004 | Whitesides et al. |
| 6,805,054 B1 * | 10/2004 | Meissl et al. .............. 101/483 |
| 6,809,356 B2 | 10/2004 | Chou |
| 6,828,244 B2 * | 12/2004 | Chou .................. 438/706 |
| 2002/0042027 A1 | 4/2002 | Chou et al. |
| 2002/0132482 A1 | 9/2002 | Chou |
| 2002/0150398 A1 | 10/2002 | Choi et al. |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2003/0217804 A1 * | 11/2003 | Guo et al. ................ 156/230 |
| 2003/0219992 A1 | 11/2003 | Schaper |
| 2004/0022888 A1 * | 2/2004 | Sreenivasan et al. .... 425/174.4 |
| 2004/0036201 A1 | 2/2004 | Chou et al. |
| 2004/0046288 A1 | 3/2004 | Chou |
| 2004/0053146 A1 | 3/2004 | Sreenivasan et al. |
| 2004/0110856 A1 | 6/2004 | Young et al. |
| 2004/0118809 A1 | 6/2004 | Chou et al. |
| 2004/0124566 A1 * | 7/2004 | Sreenivasan et al. ....... 264/494 |
| 2004/0131718 A1 | 7/2004 | Chou et al. |
| 2004/0137734 A1 | 7/2004 | Chou et al. |
| 2004/0149367 A1 * | 8/2004 | Olsson et al. ................ 156/64 |
| 2004/0156108 A1 | 8/2004 | Chou et al. |
| 2004/0197843 A1 | 10/2004 | Chou et al. |
| 2004/0200411 A1 * | 10/2004 | Willson et al. ............ 118/500 |
| 2004/0214447 A1 * | 10/2004 | Stasiak et al. .............. 438/710 |

FOREIGN PATENT DOCUMENTS

| | | |
|---|---|---|
| JP | 02-92603 | 4/1990 |
| WO | WO 99/05724 | 2/1999 |
| WO | WO 00/21689 | 4/2000 |
| WO | WO 01/33232 | 5/2001 |
| WO | WO 01/47003 | 6/2001 |
| WO | WO 01/69317 | 9/2001 |
| WO | WO 01/79592 | 10/2001 |
| WO | WO 01/90816 | 11/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/016406 | 2/2004 |
| WO | WO 2004/114016 | 12/2004 |

OTHER PUBLICATIONS

Hogan, "Impedance Control: An Approach to Manipulation," Journal of Dynamic Systems, Measurement and Control, Mar. 1985, pp. 1-7, vol. 107.

Hollis et al., "A Six-Degree-of-Freedom Magnetically Levitated Variable Compliance Fine Motion Wrist: Design, Modeling and Control," IEEE Transactions on Robotics and Automation, 1991, pp. 320-332, vol. 7, No. 3.

Tomita et al., "A 6-Axes Motion Control Method for Parallel-Linkage-Type Fine Motion Stage," Journal of Japan Society of Precision Engineering, 1992, pp. 118-124.

Slocum, "Precision Machine Design: Macromachine Design Philosophy and its Applicability to the Design of Micromachines," Micro Electro Mechanical Systems, 1992, pp. 37-42.

Merlet, "Parallel Manipulators: State of the Art Perspectives," Advanced Robotics, 1994, pp. 589-596, vol. 8.

Krauss et al., "Fabrication of Nanodevices Using Sub-25nm Imprint Lithography," Appl. Phys. Lett 67(21), 3114-3116, 1995.

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Howell et al., "Loop-Closure Theory for the Analysis and Synthesis of Compliant Mechanisms," Journal of Mechanical Design, Mar. 1996, pp. 121-125, vol. 118.

Haisma et al., "Mold-Assisted Nanolithography: A Process for Reliable Pattern Replication," Journal of Vacuum Science and Technology, Nov./Dec. 1996, pp. 4124-4128, vol. B 14(6).

Chou et al., "Imprint Lithography with Sub-10nm Feature Size and High Throughput," Microelectronic Engineering, 1997, pp. 237-240, vol. 35.

Rong et al., "Dynamics of Parallel Mechanism with Direct Compliance Control," IEEE, 1997, pp. 1753-1758.

Mittal et al., "Precision Motion Control of Magnetic Suspension Acutator Using a Robust Nonlinear Compensation Scheme," IEEE/ASME Transactions on Mechatronics, Dec. 1997, pp. 268-280, vol. 2, No. 4.

Lee et al., "An Ultraprecision Stage for Alignment of Wafers in Advanced Microlithography," Precision Engineering, 1997, pp. 113-122, vol. 21, Elsevier Science Inc., 655 Avenue of the Americas, NY, NY 10010.

Kanetomo et al., "Robot for Use in Ultrahigh Vacuum," Solid State Tech., Aug. 1997, pp. 63-64, 69-72.

Koseki et al., "Design and Accuracy Evaluation of High-Speed and High-Precision Parallel Mechanism," Proc. of the 1998 IEEE, Intl. Conf. on Robotics & Automation, May 1998, pp. 1340-1345, Leuven, Belgium.

Kim et al., "High Precision Magnetic Levitation Stage for Photolithography," Precision Engineering, 1998, pp. 66-77, vol. 22, Elsevier Science Inc., 655 Avenue of the Americas, NY, NY 10010.

Feldman et al., "Wafer chuck for manification correction in x-ray lithography," American Vacuum Society, 1998, pp. 3476-3479.

Tajbakhsh et al., "Three-Degree-of-Freedom Optic Mount for Extreme Ultraviolet Lithography," ASPE, 1998, pp. 359-362, vol. 18.

Lee et al., "Ultra Precision Positioning System for Servo Motor-Piezo Actuator Using the Dual Servo Loop and Digital Filter Implementation," ASPE, 1998, pp. 287-290, vol. 18.

Ohya et al., "Development of 3-DOF Finger Module for Micro Manipulation," Proc. of the 1999 IEEE/RSJ, Intl. Conf. on Intelligent Robots and Systems, 1999, pp. 894-899.

Tanikawa et al., "Development of Small-Sized 3 DOF Finger Moldule in Micro Hand for Micro Manipulation," Proc. of the IEEE/RSJ, Intl. Conf. on Intelligent Robots and Systems, 1999, pp. 876-881.

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assemby of Periodic Polymer Micropillar Arrays," Journal of Vacuum Science and Technology, Nov./Dec. 1999, pp. 3197-3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965-2982, vol. 17.

Choi et al., "Design of Orientation Stages for Step and Flash Imprint Lithography," Precision Engineering, Journal of the International Societies for Precision Engineering and Nanotechnology, 2001, pp. 192-199, vol. 25.

Braeuer et al., "Precise Polymer Micro-Optical Systems," MRS Bulletin, Jul. 2001, pp. 519-522.

Chou, "Nanoimprint Lithography and Lithographically Induced Self-Assembly," MRS Bulletin, Jul. 2001, pp. 512-517.

Mirkin et al., "Emerging Methods for Micro-and Nanofabrication," MRS Bulletin, Jul. 2001, pp. 506-509.

Choi et al., "High Precision Orientation Alignment and Gap Control Stages for Imprint Lithography Processes," U.S. Appl. No. 09/698,317, filed Oct. 27, 2000.

Sreenivasan et al., "High-Resolution Overlay Alignment Methods and Systems for Imprint Lithography," U.S. Appl. No. 09/907,512, filed with USPTO on Jul. 16, 2001.

Choi et al., "Method and System of Automatic Fluid Dispensing for Imprint Lithography Processes," U.S. Appl. No. 09/908,455, filed Jul. 17, 2001.

Choi et al., "Methods for High-Precision Gap and Orientation Sensing Between a Transparent Template and Substrate for Imprint Lithography," U.S. Appl. No. 09/920,341, filed Aug. 1, 2001.

Choi et al., "Flexture Based Macro Motion Translation Stage," U.S. Appl. No. 09/934,248, filed Aug. 21, 2001.

Sreenivasan et al., "Step and Repeat Imprint Lithography Systems," U.S. Appl. No. 10/194,414, filed Jul. 11, 2002.

Sreenivasan et al., "Step and Repeat Imprint Lithography Processes," U.S. Appl. No. 10/194,991, filed Jul. 11, 2002.

Meissl et al., "Method, System and Holder for Transforming Templates During Imprint Lithography Processes," U.S. Appl. No. 10/438,224, filed May 14, 2003.

Colburn et al., Step and Flash Imprint Lithography for sub-100 nm Patterning, Proceedings of SPIE vol. 3997, pp. 453-457, Jan. 1, 2000.

Johnson et al., Advances in Step and Flash Imprint Lithography, SPIE Microlithography Conference, Feb. 23, 2003.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

* cited by examiner

ASSEMBLY AND METHOD FOR TRANSFERRING IMPRINT LITHOGRAPHY TEMPLATES

BACKGROUND OF THE INVENTION

The present invention relates generally to imprint lithography. More particularly, the present invention is directed to an assembly and method to transfer templates during imprint lithography processes.

Micro-fabrication techniques can produce structures having features on the order of nanometers. Micro-fabrication is used in a wide variety of applications, such as the manufacturing of integrated circuits (i.e. semiconductor processing), biotechnology, optical technology, mechanical systems, and micro-electro-mechanical systems ("MEMS").

Imprint lithography is a type of micro-fabrication technique that is becoming increasingly important in semiconductor processing and other applications. Imprint lithography provides greater process control and reduction of the minimum feature dimension of the structures formed. This in turn provides higher production yields and more integrated circuits per wafer, for example.

Micro-fabrication can be used to form a relief image on a substrate, such as a semiconductor wafer. The substrate typically has a transfer layer that is coated with a thin layer of polymerizable fluid, thermoplastic, or other imprint material capable of being formed (i.e. molded or imprinted) into a desired structure. A mold with a relief structure makes mechanical contact with the substrate and the polymerizable fluid or other imprint material fills the relief structure of the mold. The polymerizable fluid is then polymerized to form the desired structure on the transfer layer, which is complementary to the relief structure of the mold. The transfer layer and the solidified polymeric material can then be etched to form a relief image in the transfer layer, or coated with a thin-film layer of other material, for example.

Imprint lithography systems often use an imprint head with a mold, also called a template, which can be installed and removed from the imprint head. This allows the imprint lithography system to be used to imprint different patterns. In this manner, the imprint lithography system can be used to fabricate various types of circuits or other devices, or imprint various structures on a substrate.

To ensure high resolution imprinting it is generally desirable to minimize handling of the template in order to avoid damage to the template and contamination to the template and imprint lithography system with dust or other particulates. To that end, there is a need to store, load, and unload templates in a manner that avoids physical damage to the relief pattern of the mold and contamination to the template and imprint lithography system.

SUMMARY OF THE INVENTION

A template transfer assembly and method features a template transfer substrate and a template having first and second sides, with the first side facing away from the template transfer substrate and the second side facing the template transfer substrate and having mold pattern formed thereon. Polymerized imprint material is disposed between the second side and the template transfer substrate to fixedly attach the template to the template transfer substrate. The method of transferring an imprint lithography template includes dispensing a selected volume of imprinting fluid onto the template transfer substrate, placing the template upon the selected volume and converting the imprinting fluid to solid imprint material. The selected volume of imprint material is of sufficient quantity to fixedly attach the template to the template transfer substrate while maintaining a space between the mold and the template transfer substrate. These and other embodiments are described more fully below.

DETAILED DESCRIPTION OF THE INVENTION

Figure 1:
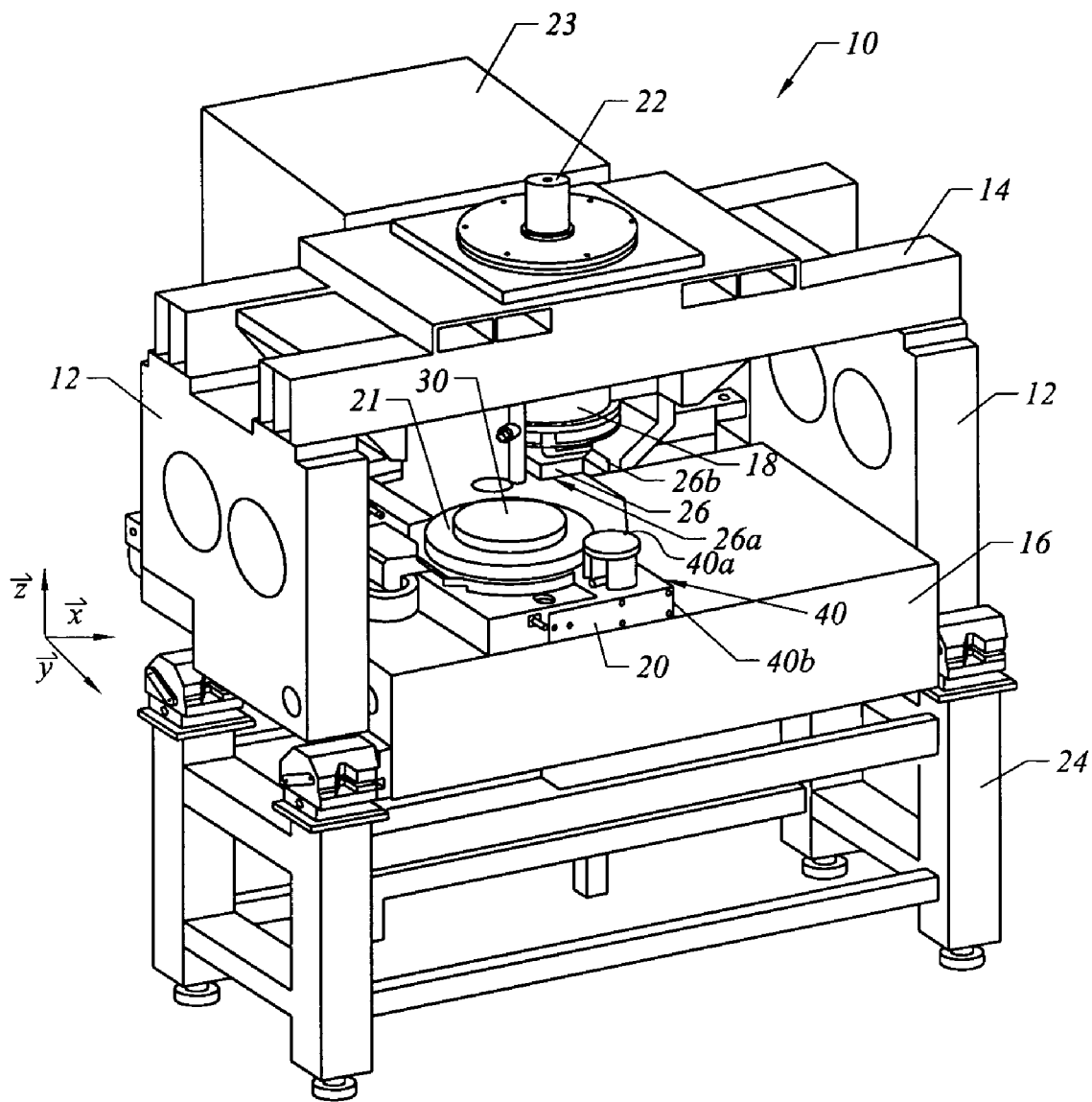
FIG. 1 is a perspective view of an imprint lithography system for practicing embodiments of the present invention.

FIG. 1 is a perspective view of an imprint lithography system 10 for practicing embodiments of the present invention. A pair of spaced-apart bridge supports 12 having a bridge 14 and a stage support 16 extending therebetween. Bridge 14 and stage support 16 are spaced-apart. Coupled to bridge 14 is an imprint head 18 that extends from bridge 14 toward stage support 16 and may move along and/or rotate about, X, Y and/or Z axes. Disposed upon stage support 16 to face imprint head 18 is a motion stage 20 and a template transfer system 40. Motion stage 20 is configured to move with respect to stage support 16 along one or more degrees of freedom. For example, motion stage 20 may move along and/or rotate about, X, Y and/or Z axes. In the present example, motion stage 20 holds a wafer 30 on a wafer chuck 21, which is typically a vacuum chuck, and moves wafer 30 along the X and Y axes. A radiation source 22 is coupled to imprint lithography system 10 to impinge actinic radiation upon motion stage 20. Radiation source 22 is coupled to bridge 14 and includes a power generator 23 connected to radiation source 22.

Figure 2:
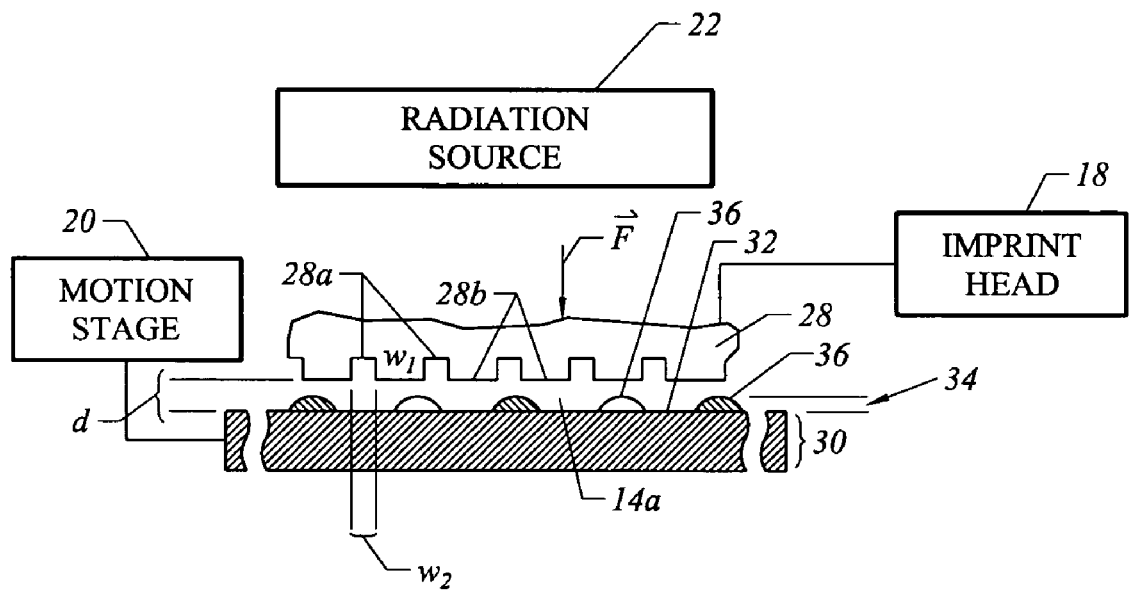
FIG. 2 is a simplified side view of the imprint lithography system, shown in FIG. 1, demonstrating the spatial relationship between the mold and the wafer having imprinting material disposed thereon.

Referring to both FIGS. 1 and 2, a template 26 is removably connected to imprint head 18. Template 26 has first and second sides 26a and 26b. First side 26a faces imprint head 18, and second side 26b has a mold 28 thereon facing away from imprint head 18 toward wafer chuck 21. Mold 28 generally includes a plurality of features defined by a plurality of spaced-apart recessions 28a and protrusions 28b, having a step height, h, on the order of nanometers (e.g. 100 nanometers). The plurality of features defines an original pattern that is to be transferred onto a wafer 30 positioned on motion stage 20. To that end, a distance, d, between mold 28 and a surface 32 of wafer 30 may be varied. It should be understood that surface 32 may comprise of material from which wafer 30 is formed, including any native oxide formed thereon and/or one or more layers of material deposited on wafer 30.

An imprinting layer 34 is disposed on wafer 30. Imprinting layer 34 is generally a selected volume of imprint material, such as polymerizable fluid, applied to wafer 30, either as a plurality of spaced-apart beads 36, as shown, or in a continuous film. Exemplary imprint material is described in U.S. patent application Ser. No. 10/178,947, filed Jun. 24, 2002 and entitled "Low Viscosity High Resolution Patterning Material", which is incorporated by reference herein in its entirety. An exemplary method and system for depositing the imprint material is disclosed in U.S. patent application Ser. No. 10/191,749, filed Jul. 2, 2002 and entitled "System and Method for Dispensing Liquids", which is incorporated by reference herein in its entirety.

Figure 3:
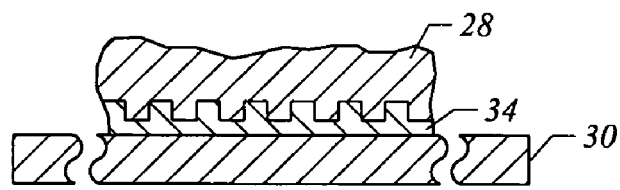
FIG. 3 is a simplified side view of the mold of FIG. 2 in contact with the imprinting layer.

Referring to FIG. 3, a simplified side view of mold 28 is shown in contact with imprinting layer 34. Imprinting layer 34 is generally flowable when mold 28 is brought into contact with imprinting layer 34 by creating relative movement between the imprint head 18, shown in FIG. 1, and wafer 30 along the Z axis. In the present example, the relative movement is achieved by moving imprint head 18 along the Z axis. The imprint material flows to form a contiguous layer that fills mold 28. The imprint material is then converted to a non-flowable (i.e. solid) state, such as by polymerization with actinic radiation, in the case of a polymerizable fluid imprint material, or by cooling, in the case of a thermoplastic imprint material.

Figure 4:
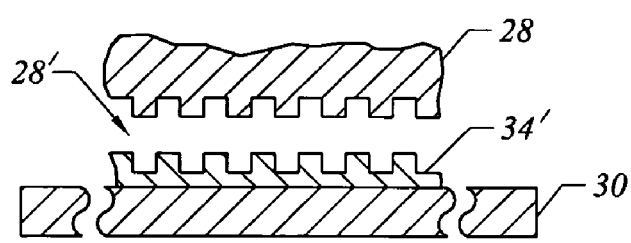
FIG. 4 is a simplified side view of an imprinting layer, shown in FIG. 2, patterned according to the template.

FIG. 4 is a simplified side view of imprinting layer 34' patterned according to mold 28. Mold 28 has been removed from imprinting layer 34' by moving the imprint head 18, shown in FIG. 1, away from wafer 30. A structure 28' recorded in imprinting layer 34' is produced, in part, by mechanical contact with mold 28, and is generally an image of mold 28. Wafer 30 with structure 28' may then be further processed.

Mold 28 has features sized according to the structure 28' desired to be imprinted to imprinting layer 34', which can be on the order of nanometers. It is important to protect mold 28 from physical damage and/or contamination so that the desired structure 28' is obtained when imprinting substrates. Template 26 is removable from imprint head 18 of imprint lithography system 10, shown in FIG. 1. Another template can then be installed in imprint head 18. For example, if template 26 wears out or is damaged, a replacement template may be installed, or a template with a different mold (i.e. structure or pattern) may be installed to imprint a different structure.

Template 26 is removably secured to imprint head 18 with vacuum and/or mechanical means, such as pins or clips. Mechanical means are desirable to ensure retention of template 26 in imprint head 18 in the event of a vacuum failure or in the event that vacuum is turned off during processing. Mechanical means of securing template 26 in imprint head 18 may also be convenient when installing or removing template 26.

To facilitate coupling template 26 to imprint head 18, the template 26 is typically stored on template transfer system 40 so that first side 26a faces imprint head 18. When coupling together template 26 and imprint head 18, template 26 and imprint head 18 are placed in very close proximity (e.g. 10's of microns or less) to one another so that the template 26 can be secured to imprint head 18 by vacuum and/or mechanical contact. Manual insertion of the template 26 into imprint head 18 is typically avoided due to the increased probability of damage to the template 26 and/or imprint head 18, as well as the increased probability of contamination of the imprint lithography system 10, particularly the motion stage 20.

Figure 5:
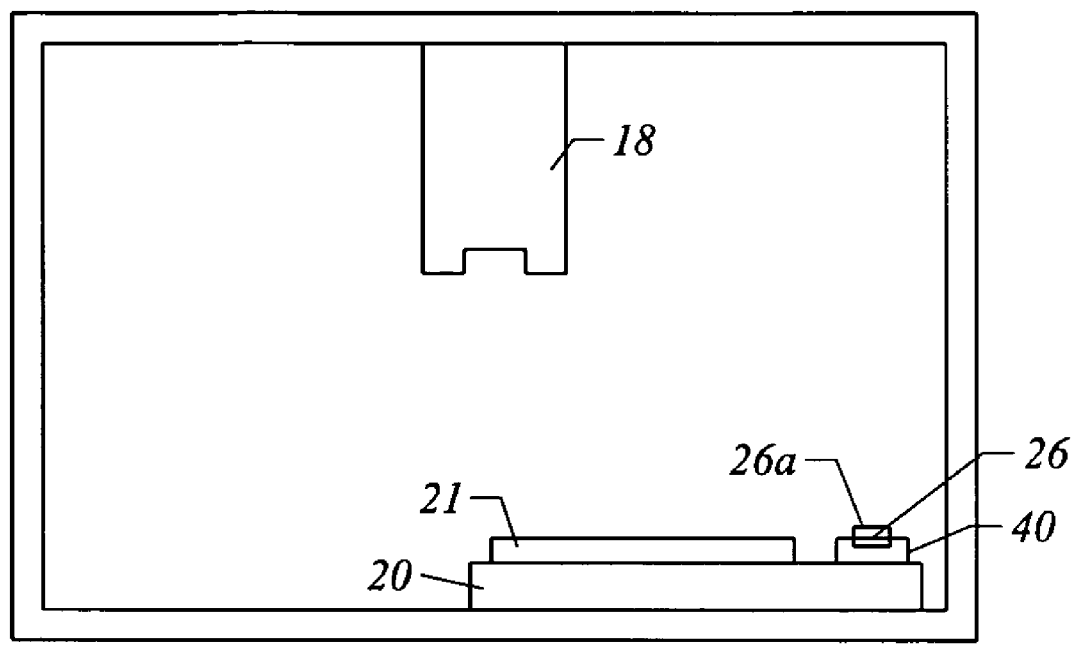
FIG. 5 is a simplified side view of the lithographic system, shown in FIG. 1, with a template transfer holder in a motion stage according to an embodiment of the present invention.

Referring to FIG. 5, shown is a simplified side view of a portion of imprint lithography system 10, shown in FIG. 1, with template transfer system 40 on a motion stage 20, according to an embodiment of the present invention. Template transfer system 40 may be permanently affixed to motion stage 20, or alternatively, may be removably mounted to motion stage 20. An advantage of template transfer system 40 being permanently affixed to motion stage 20 is that the position of template transfer system 40 is precisely repeatable. An advantage of template transfer system 40 being removably attached to motion stage 20 is that template transfer system 40 may be removed after installing template 26 into imprint head 18, which reduces the mass of motion stage 20 and therefore does not affect stage performance during imprinting. Similarly, sensors and vacuum conduits might be more easily implemented if template transfer system 40 is permanently affixed to motion stage 20, and would not require attachment or alignment mechanisms to repeatedly install template transfer system 40 on motion stage 20.

It is generally desirable that template transfer system 40 be located in a position on motion stage 20 that allows template transfer system 40 to be brought to a convenient position for loading template 26 into template transfer system 40, and then to be brought underneath imprint head 18 without compromising wafer imprinting. Many motion stages have a range of motion greater than the range required to imprint the entire surface of a wafer 30, shown in FIG. 1, mounted on wafer chuck 21, and allow mounting template transfer system 40 on a portion of motion stage 20 that is accessible by imprint head 18, but that does not interfere with wafer imprinting.

Figure 6:
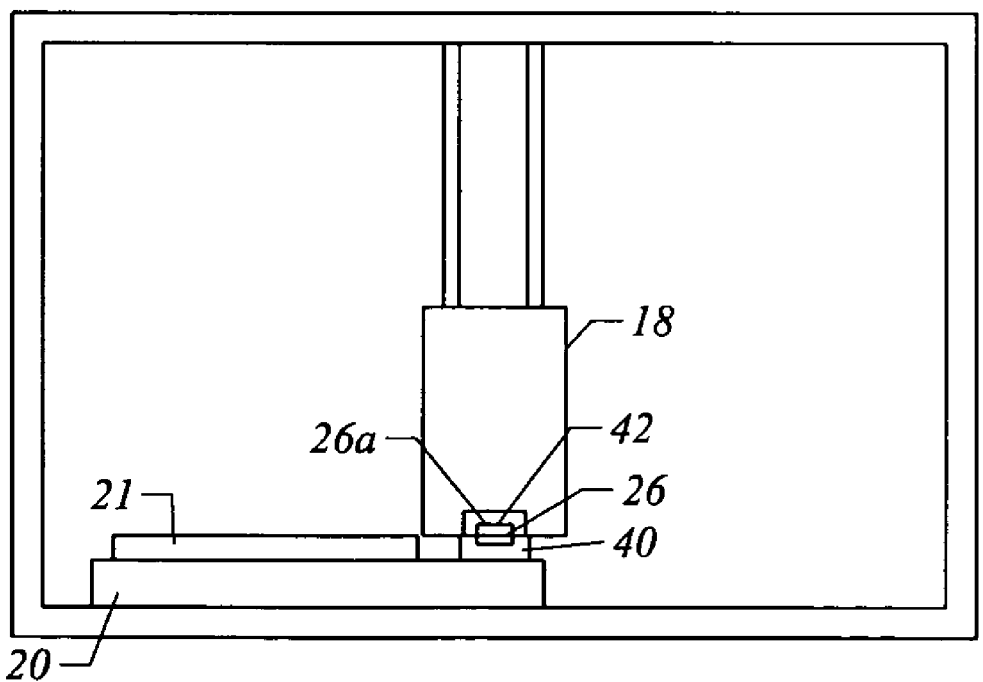
FIG. 6 is a simplified side view of the template transfer holder of FIG. 5 in position to load the template in an imprint head.

Referring to FIG. 6, shown is a simplified side view of template transfer system 40 of FIG. 5, in position to load template 26 in imprint head 18. To that end, motion stage 20 has been moved so that template 26 in template transfer system 40 is beneath imprint head 18. Imprint head 18 includes a pocket 42 or other structure for receiving template 26. Vacuum and/or mechanical retention means for holding template 26 in imprint head 18 are omitted for simplicity of illustration. Imprint head 18 and template 26 are placed in close proximity to one another, and template 26 is securely retained in imprint head 18.

After loading template 26 into imprint head 18, the relative positions of imprint head 18 and motion stage 20 are established to imprint a wafer (not shown) loaded onto wafer chuck 21. Upon completion of imprinting processes, template 26 may be removed from imprint head 18 by reversing the sequence of loading steps, and load another template into imprint head 18, if desired.

Figure 7:
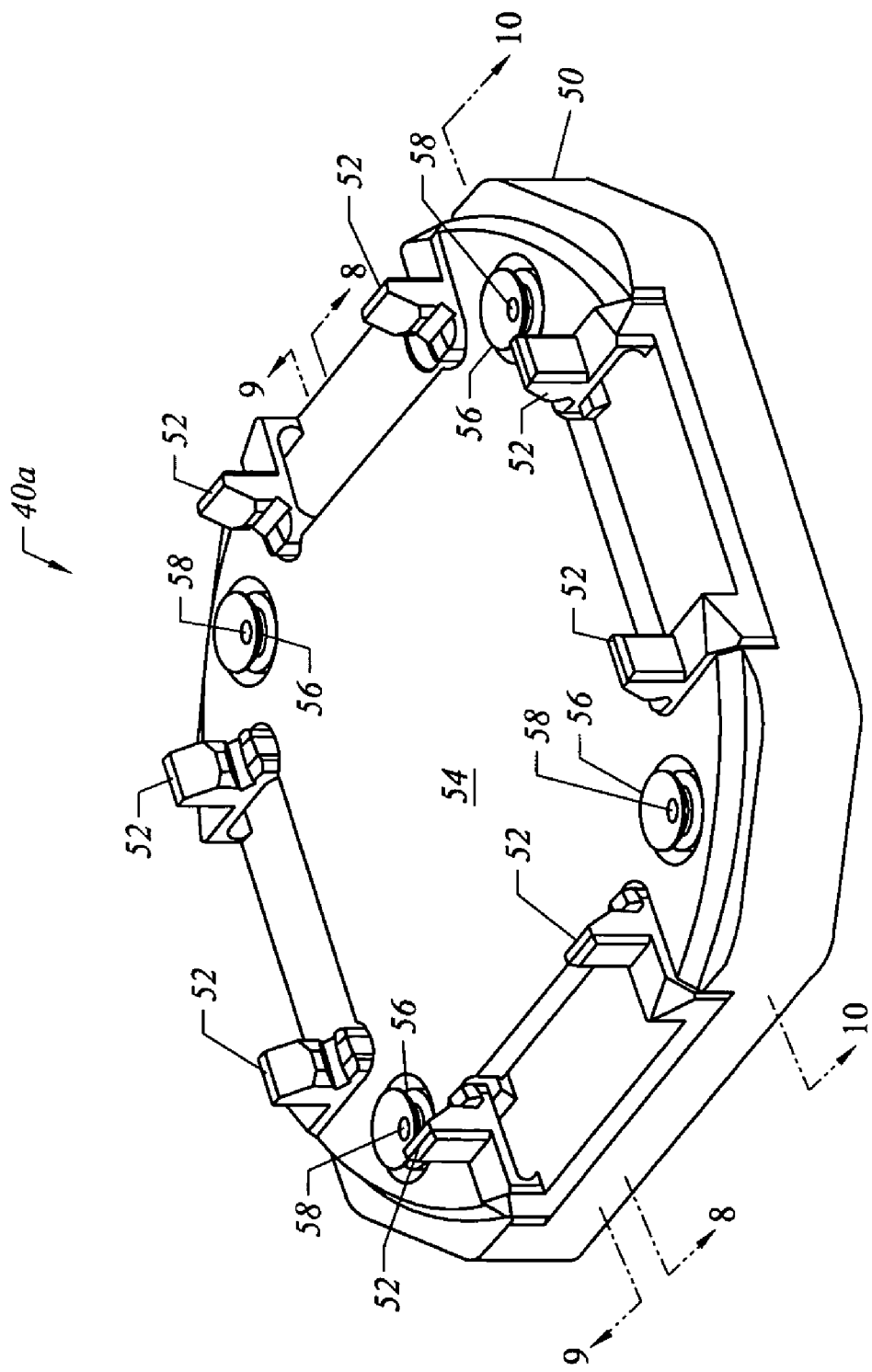
FIG. 7 is a perspective view showing a template transfer holder of the template transfer system, shown in FIGS. 1, 5 and 6, in accordance with one embodiment of the present invention.

Referring to FIGS. 1, 2 and 7, important characteristics demonstrated by template transfer system 40 is to prevent movement of template 26 when housed therein, as well as to prevent mold pattern 28 from being damaged and minimize particulate contamination as a result of movement of the template 26 to and from template transfer system 40. To that end, template transfer system 40 includes a template transfer holder 40a and, optionally, a template transfer gimbal 40b. Template transfer gimbal 40b allows angular movement of template transfer holder 40a about three orthogonal axes.

Template transfer holder 40a includes a body 50 having a plurality of tines 52 extending from a common side 54 of body 50. Also protruding from side 54 is a plurality of compliant members 56, each of which has a throughway 58. Throughway 58 is in fluid communication with a channel 60, shown in FIG. 8, extending from side 54 into body 50. A central channel 62 is in fluid communication with one or more exit channels 64 that have couplings 66 connected to a side 68 of body 50 disposed opposite to side 54. Couplings 66 facilitate connecting channels 60 to a pump system 70 via elastic tubing 67 coupled between channels 60 and couplings 66. Pump system 70 may create vacuum or positive pressure, dependent upon the application.

Figure 8:
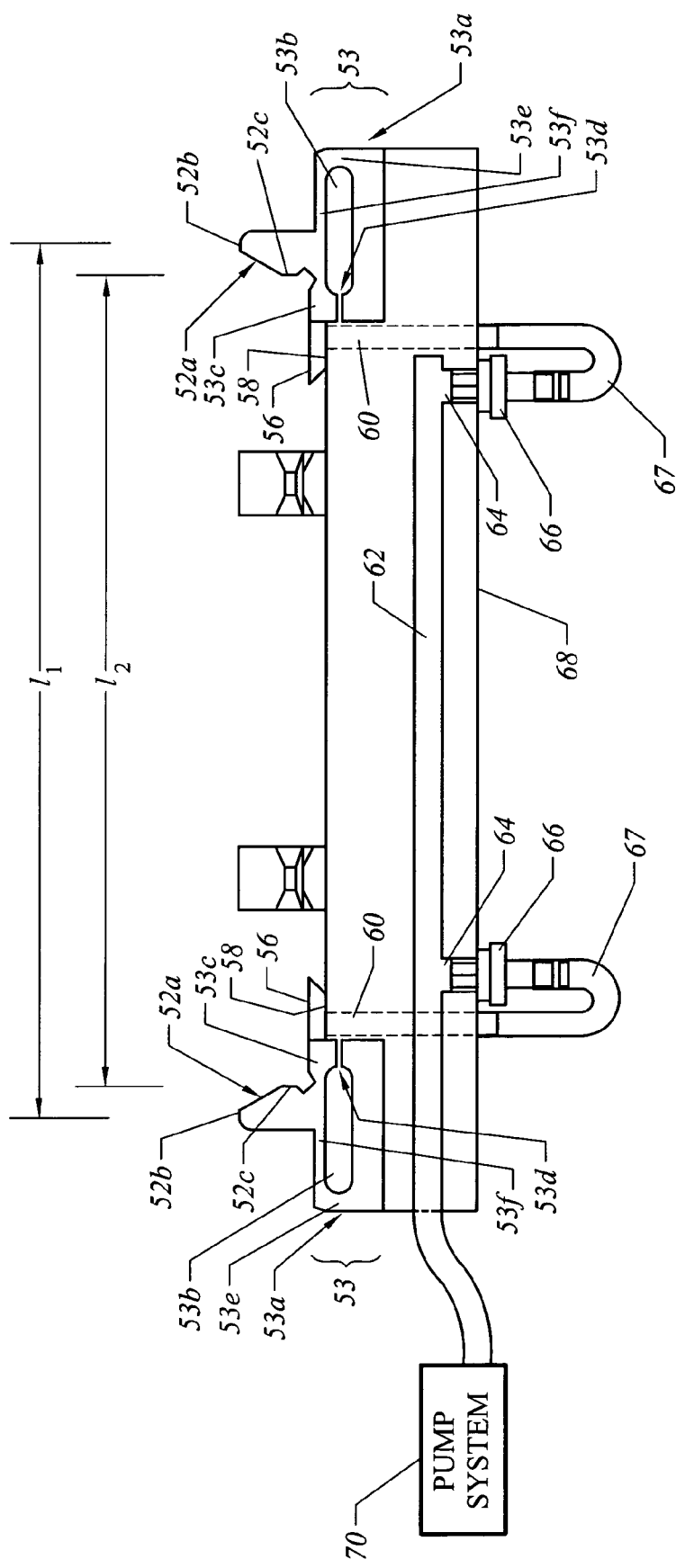
FIG. 8 is a cross-sectional view of the template transfer holder, shown in FIG. 7, taken along lines 8—8.

Referring to FIGS. 7 and 8, each of tines 52 includes an oblique surface 52a that is substantially smooth. Oblique surface 52a extends from a first end 52b of tine 52, disposed opposite to side 54 and extends toward a second end 52c of tine 52 positioned between oblique surface 52a and end 52b. End 52c is coupled to, or integrally formed with, a resilient member 53 coupled between body 50 and tine 52. Side 54 extends from end 52b and angles inwardly toward the tine 52 disposed on an opposite edge of body 50. In this manner, a length $l_1$ between ends 52b of opposed tines 52 is greater than a length $l_2$ between ends 52c of opposed tines 52. The dimensions of 12 are established to be slightly larger than the template 26, shown more clearly in FIG. 9. Referring to both FIGS. 8 and 9, resilient member 53 includes a body 53a having a void 53b formed therein. A detent 53c is positioned proximate to end 52c and extends therefrom to selectively contact a perimeter region 26d of template 26. In superimposition with detent 53c is a gap 53d extending through body 53a into void 53b to facilitate bending of resilient member 53 about pivot point 53e. Pivot point 53e is positioned substantially opposite to gap 53d, and a moment arm 53f extends between detent 53c and pivot point 53e. Tine 52 rests upon moment arm 53f.

Figure 9:
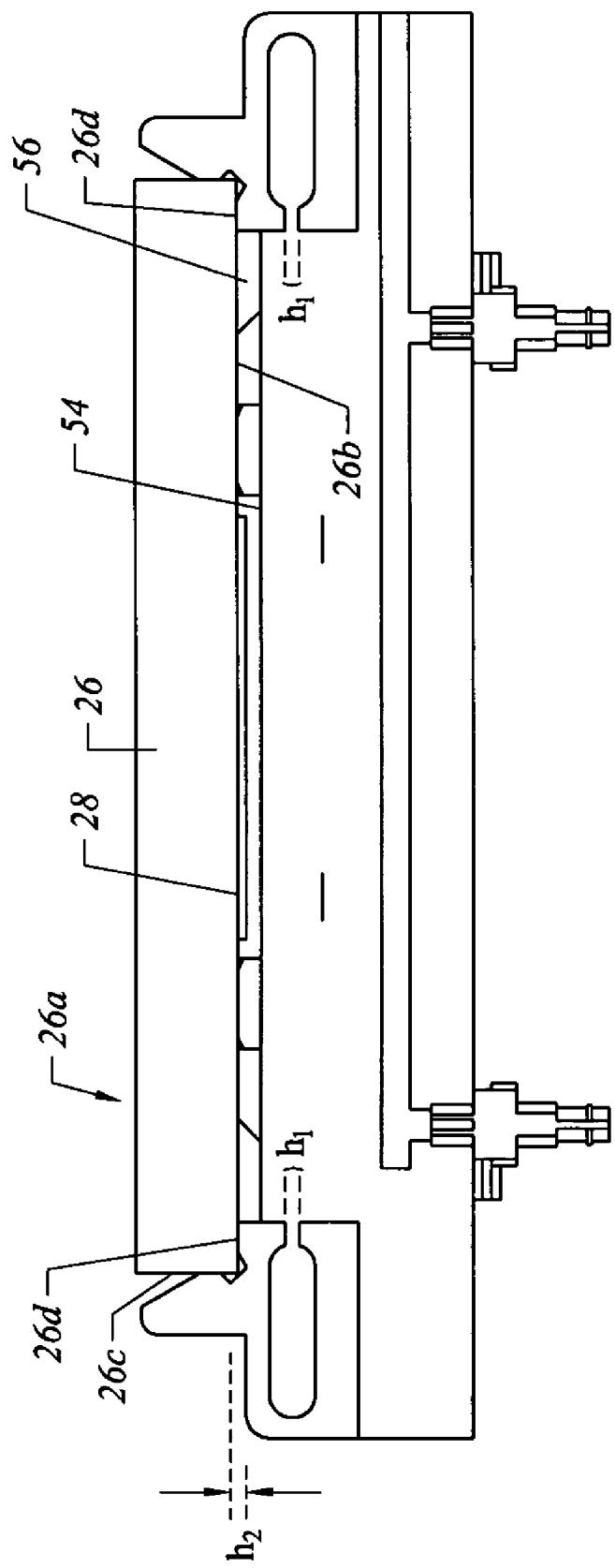
FIG. 9 is a cross-sectional view of the template transfer holder, shown in FIG. 7, taken along lines 9—9, and having a template disposed therein.

Referring to both FIGS. 8 and 9, oblique surfaces 52a function to guide template 26 onto template transfer holder 40a, shown in FIG. 1, so as to minimize frictional contact with template 26. To that end, tines 52, shown in FIG. 7, are formed from a compound having minimal friction, such as a TEFLON®-containing material, e.g., a PTFE-filled Acetal. An exemplary material is sold under the tradename DELRIN AF®, available from DuPont®. Resilient members 53 are structured to allow tines 52 to bend toward template 26 and clamp against template edge 26c to center template 26 on transfer template holder 40a.

Figure 10:
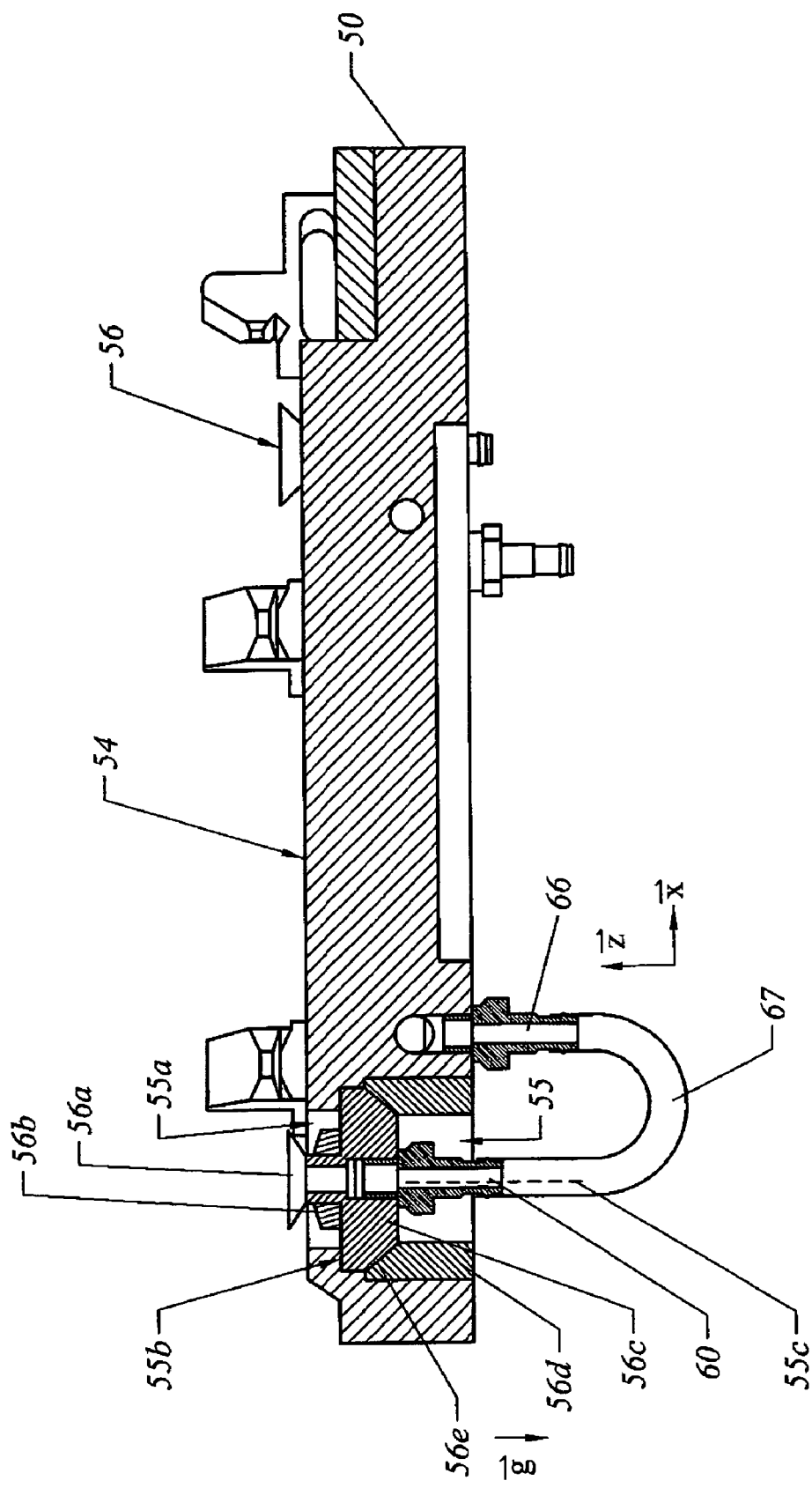
FIG. 10 is a simplified side view of the template transfer holder, shown in FIG. 7, taken along lines 10.

Referring to FIGS. 8, 9 and 10, to facilitate clamping of template 26 by tines 52, shown in FIG. 7, compliant members 56 are formed from DELRIN AF® and include a suction cup 56a and a detent 56b disposed opposite to suction cup 56a. Body 50 includes a chamber 55 in which a boss 56c is disposed, with detent 56b being disposed in chamber 55 resting on boss 56c. The volume of chamber 55 is greater than the volume of either detent 56b or boss 56c, allowing the same to move freely within chamber 55 along three orthogonal axes. Chamber 55 includes an opening 55a disposed in side 54 through which a sub-portion of compliant member 56 passes to allow suction cup 56a to extend from side 54. However, the cross section of opening 55a is less than a cross section of boss 56c. As a result, the region of body 50 surrounding opening 55a forms a bearing surface 55b against which boss 56c bears when a vacuum is applied to template 26. Boss 56c is coupled to a channel 60 that extends through chamber 55. Detent 56b is resiliently biased against a portion of boss 56c positioned proximate to opening 55a. In this manner, compliant member 56, boss 56c and channel 60 move as a unit within chamber 55. In the absence of a vacuum, boss 56c rests against a bushing 56d disposed in chamber 55 to maintain boss 56c within chamber 55. An interface 56e of a surface of boss 56c and a surface of bushing 56d has a frusto-conical shape that is symmetrical about an axis 55c of chamber 55. The frusto-conical shape of interface 56e centers suction cup 56a with respect to chamber 55. To that end, tubing 67 functions as a dead weight under force of gravity g, pulling channel 60 downwardly. Upon application of a vacuum to template 26, pump system 70 operates to evacuate central channel 62, thereby exerting a compression force between compliant member 56 and template 26. The compression force urges boss 56c against bearing surface 55b. Once boss 56c bears against bearing surface 55b, movement along Z axis is minimized, if not prevented. However, boss 56c may still move along the X and Y axes.

As a result of compression of template 26 against compliant members 56, a perimeter region 26d of template 26 bears against detent 53c and moves along the Z axis about pivot point 53e. Member arm 53f cantilevers toward surface 52a causing end tines 52 to move inwardly toward template 26 until template edge 26c is compressed by ends 52c. Each of tines 52 is arranged to move approximately the same extent as the remaining tines 52 on body 50. The free movement of detent 56b and boss 56c along X and Y axes, as well as the movement of tines 52, results in template 26 being placed at a predefined location on body 50, each time template 26 is loaded thereon. In the present example, template 26 is centered on body 50. This is referred to as the final seating position. In the final seating position, mold 28 is spaced-apart from side 54. To that end, gap 53d is provided with a height $h_1$, and mold 28 extends from side 26b having a height, $h_2$. Heights $h_1$ and $h_2$ are established to ensure that upon reaching the final seating position mold 28 does not contact surface 52a. Thus, the structural integrity of mold 28 is preserved, while allowing template 26 to be removed and inserted into template transfer holder 40a with imprint head 18, shown in FIG. 1.

Figure 11:
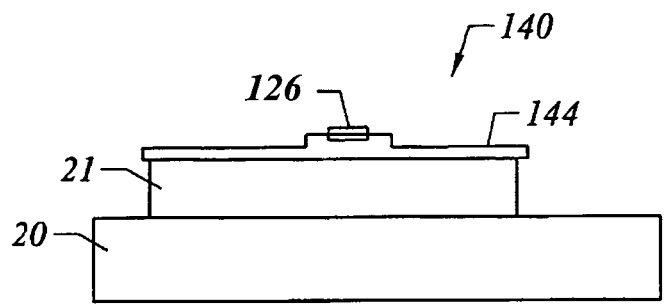
FIG. 11 is a simplified side view of the template transfer holder on a transfer substrate, shown in FIG. 5, according to another embodiment of the present invention.

Referring to FIGS. 1 and 11, shown is a simplified side view of a template transfer system 140 that is removably mounted to motion stage 20. Template transfer system 140 includes a transfer substrate 144, and template 126 may be affixed thereto using imprint material, discussed more fully below. Transfer substrate 144 can be made from any of a variety of materials, such as aluminum, stainless steel, glass, ceramic, silicon and the like. Further, the transfer substrate 144 may be bigger or smaller than the production wafers (substrates) that will be imprinted. A transfer substrate 144 that is the same size as production wafers enables using the alignment structure on wafer chuck 21, normally used for production wafers. With this configuration, transfer substrate 144 is compatible for use with existing wafer handling systems, e.g., robots, cassettes and the like. This is beneficial because template 126 and transfer substrate 144 may be manipulated using a wafer handling system, instead of manually.

Template transfer system 140 can be located anywhere-on transfer substrate 144 accessible by the imprint head 18. Motion stage 20 does not need additional motion range to position template transfer system 140 under imprint head 18. Contamination of wafer chuck 21 by the backside of transfer substrate 144 may be reduced by proper handling of transfer substrate 144.

Figure 12:
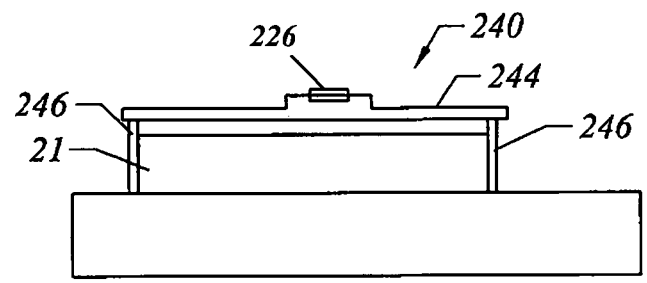
FIG. 12 is a simplified side view of a template transfer holder on a transfer substrate above the wafer chuck, shown in FIG. 5, according to another embodiment of the present invention.

Referring to FIGS. 1 and 12, shown is a simplified side view of a template transfer system 240 on a transfer substrate 244 spaced-apart from wafer chuck 21, according to another embodiment of the present invention. The position of template 226 and template transfer substrate 244 may be fixed employing imprint material, discussed more fully below. Legs 246 support transfer substrate 244 above wafer chuck 21, thereby avoiding contamination of the surface of wafer chuck 21 from contact with the backside of transfer substrate 244 (i.e. the side opposite template transfer system 240). Alternatively, legs 246 that extend from transfer substrate 244 onto a perimeter region of wafer chuck 21, or a perimeter ledge or other structure, are used to support transfer substrate 244 above wafer chuck 21.

Figure 13:
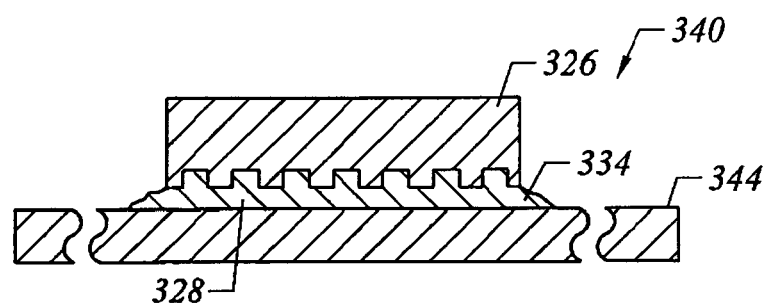
FIG. 13 is a simplified cross section of a template transfer assembly that may be employed in the lithographic system, shown in FIGS. 1 and 5, having a template coupled to a template transfer substrate with imprint material according to an embodiment of the present invention.

Referring to FIGS. 1 and 13, shown is a simplified cross section of a template transfer assembly 340 having template 326 coupled to a template transfer substrate 344 with solid imprint material 334, according to an embodiment of the present invention. Template transfer substrate 344 could be a process wafer, for example. Template 326 is stored on template transfer substrate 344 when not in use, and template 326 can be loaded from template transfer substrate 344 into imprint head 18.

When it is desired to unload and store template 326 from imprint head 18 (e.g. after imprinting a run of process wafers), template transfer substrate 344 is mounted on wafer chuck 21. A selected volume of imprinting material is applied in a fluid state to the region of template transfer substrate 344 that template 326 will be attached to. The volume of fluid may be less than, the same as, or greater than the volume of imprinting material that would be used to imprint a production wafer.

Template 326 is brought into contact with the imprinting material, and the imprinting material is polymerized or otherwise solidified fixedly affixing template 326 to template transfer substrate 344. Rather than increasing a distance between the imprint head 18 and the wafer chuck 21, vacuum and/or mechanical retaining means may be deactivated to release template 326 from the imprint head 18. Template 326 adheres to template transfer substrate 344 with solid imprint material 334, and may be moved therewith to a remote storage location.

Alternatively, template transfer substrate 344 may be left on the wafer chuck 21 and template 326 is removed from or retained in the imprint head 18. In each case, solid imprint material 334 protects the mold pattern 328 on template 326 when not in use. Solid imprint material 334 seals template 326 from contamination and the mold pattern 328 on the face of template 326 is protected from damage. This may be achieved by covering the entire area of mold pattern 328 with the imprint material 334, thereby hermetically sealing mold pattern 328.

When template 326 is removed from the imprint head 18 for storage again, a new or reworked template transfer substrate is used. Alternatively, the same substrate may be employed to store template 326, but the template 326 would be stored in a differing region thereof. A template transfer substrate 344 is reworked by removing solid imprint material 334 from template transfer substrate 344. Process wafers rejected before imprinting are often convenient for use as template transfer substrates 344.

Figure 14:
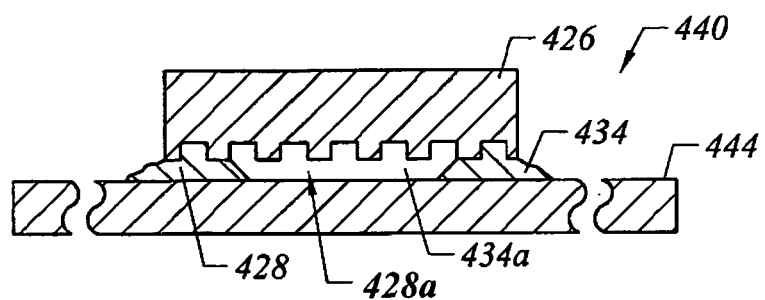
FIG. 14 is a simplified cross section of a template transfer assembly, shown in FIG. 13, with a template coupled to a template transfer substrate with a perimeter of imprint material according to an alternate embodiment of the present invention.

Alternatively, as shown in FIG. 14, template transfer holder 440 may include having imprinting material 434 applied to a sub-portion 428a of mold pattern 428. To that end, the imprint material 434 is applied in sufficient quantity to allow sub-portion 428a to be spaced-apart from both the template transfer substrate 444 and the imprint material 434. Further, by circumscribing sub-portion 428a with imprinting material 434, sub-portion 428a may be encapsulated, e.g., hermetically sealed so that the only atmosphere to which mold pattern 428 is exposed is present in volume 434a to which sub-portion 428a is exposed. This prevents ingress of contamination into sub-portion 428a of mold pattern 428 during storage.

When it is desired to store template 426, the same may be attached to template transfer substrate 444 with solid imprint material 434 to fixedly attach template transfer substrate 444 to template 426. To that end, template transfer substrate 444, having imprinting material 434, is loaded onto the wafer chuck 21 and template 426 is moved to a position underneath the imprint head 18 (if not already loaded). Relative movement between the imprint head 18 and template 426 is achieved to reduce the spacing therebetween, placing the imprint head 18 and the template 426 in close proximity or contact. The template 426 is secured to the imprint head 18 by means of a vacuum and/or mechanical coupling. The imprint head 18, along with template 426 is placed in superimposition with template transfer substrate 444. Thereafter, contact is made between template 426 and imprint material 434 present on template transfer substrate 444. The imprint material 434 is then solidified, as discussed above, securely affixing template 426 to template transfer substrate 444.

Figure 15:
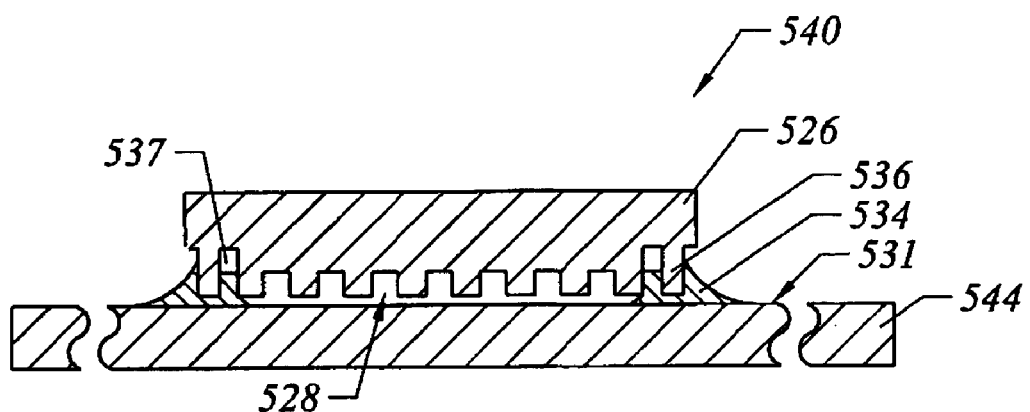
FIG. 15 is a simplified cross section of a template transfer assembly, shown in FIG. 13, with a template coupled to a template transfer substrate with a perimeter of imprint material according to a second embodiment of the present invention.

Referring to FIG. 15, shown is a simplified cross section of a template transfer holder 540 having a template 526 coupled to the template transfer substrate 544 with a perimeter of solid imprint material 534 according to another embodiment of the present invention to fixedly attach template transfer substrate 544 to template 526. In this configuration, the entire mold pattern 528 may be encapsulated, e.g., hermetically sealed as discussed above with respect to FIG. 14. Further, template 526 may, optionally, include a perimeter mesa 536 that forms a perimeter recess 537 around the mold pattern 528. Imprint material 534 does not adhere to a mold pattern 528 on template 526, thus facilitating mold fidelity.

To store template 526 on template transfer substrate 544, a selected volume of imprinting material 534 is applied in a fluid state to a surface 531 of template transfer substrate 544. The imprinting material 534 may be applied to a selected area (e.g. an area corresponding to the perimeter of template 526), or the volume of imprinting material 534 is selected to adhere to the perimeter mesa 536 only, and to not fill in areas of mold pattern 528 on template 526. Recess 537 prevents fluid imprinting material 534 from reaching mold pattern 528 when mechanical contact is made between the imprinting material 534 and template 526.

Figure 16:
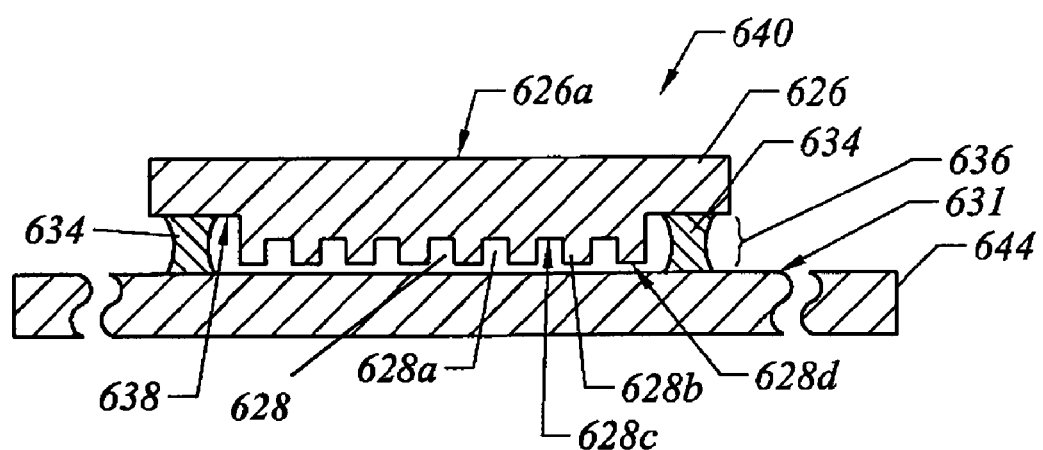
FIG. 16 is a simplified cross section of a template transfer assembly, shown in FIG. 13, with a template coupled to a template transfer substrate with a perimeter of imprint material according to a third alternate embodiment of the present invention.

FIG. 16 is a simplified cross section of a template transfer assembly 640 having a template 626, a mesa 636 and a major surface 626a disposed opposite to the mesa 636. A mold pattern 628 is included on the mesa 636 as having grooves 628a and protrusions 628b. The grooves 628a include a nadir surface 628c and the protrusions 628b include an apex surface 628d. A surface 638 circumscribes, if not all, then a subset of the grooves 628a and the protrusions 628b. One or more of nadir surfaces 628c are spaced apart from major surface 626a a first distance $d_1$, and one or more apex surfaces 628d are spaced-apart from major surface 626a a second distance, $d_2$. Surface 638 is spaced apart from major surface 626a a third distance, $d_3$. Mesa 636 is defined by ensuring third distance $d_3$ differs from both first and second distances, $d_1$ and $d_2$. In the specific example, distance $d_3$ is less than either of distances $d_1$ and $d_2$. Imprinting material 634 is disposed in regions between surface 638 and surface 631 of template transfer substrate 644. In this fashion, imprint material 634 may be employed to maintain a fixed position between template 626 and template transfer substrate 644 without imprint material 634 contacting mold pattern 628 on template 626. Additionally, imprinting material 634 may be disposed so as to encapsulate mold pattern 628, e.g., hermetically seal the same, as discussed above. In this manner, mold pattern 628 is protected from physical damage and contamination.

To store template 626 a selected volume of imprinting material 634 is applied in a fluid state to a surface 631 of template transfer substrate 644. The imprinting material 634 is applied to a region of surface 631 that will be in superimposition with surface 638. The volume of imprinting material 634 typically selected is sufficient to adhere template 626 to the template transfer substrate 644 so that mold pattern 628 is spaced-apart from surface 631. Although it is not necessary, imprinting material 634 may circumscribe mold pattern 628, thereby encapsulating the same to prevent contamination by particulate matter.

Figure 17:
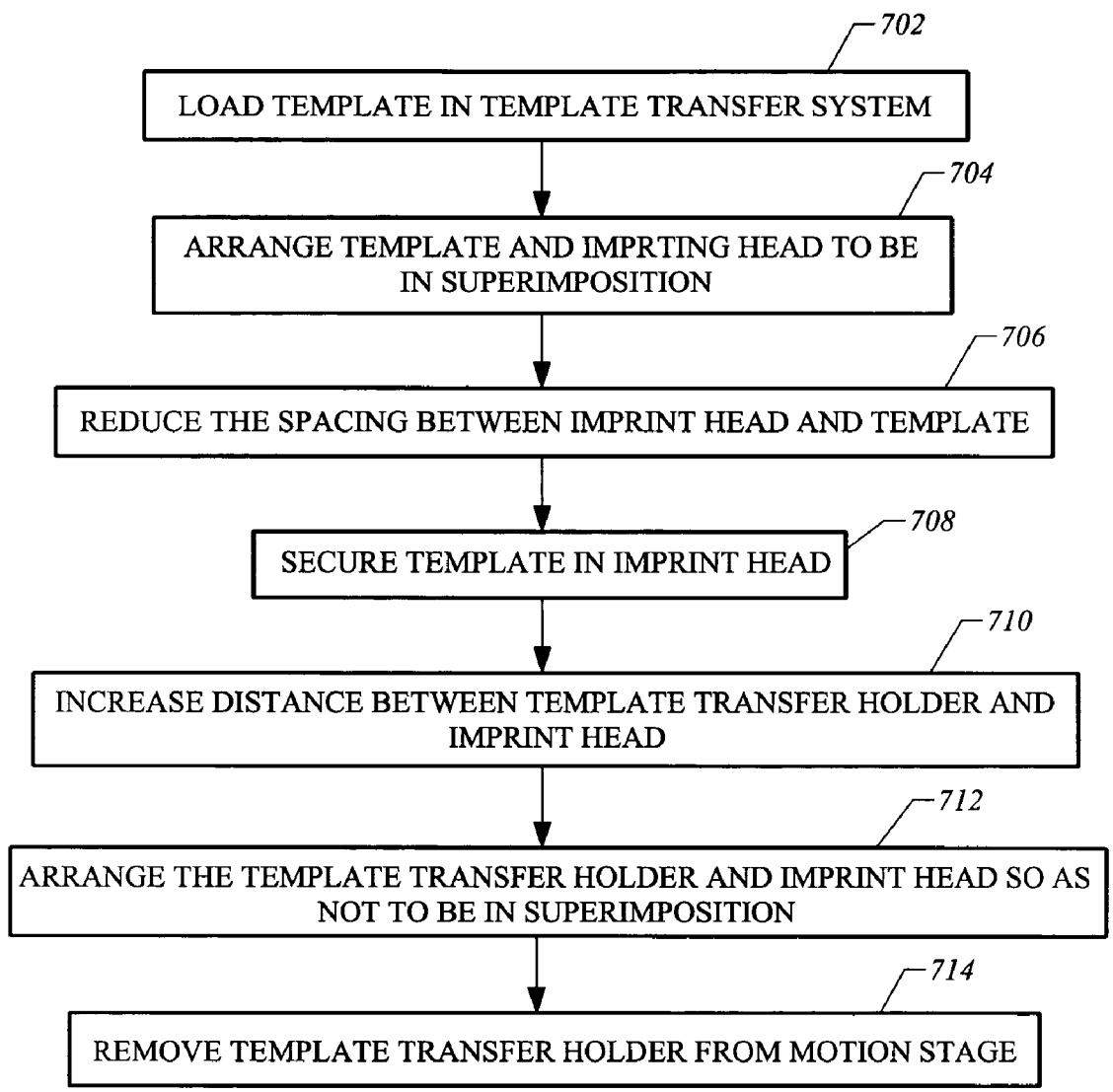
FIG. 17 is a simplified flow chart of a method of handling a template in a lithographic system, shown in FIGS. 1, 2, 3, 4, 5, 11, 12, 13, 14, 15 and 16, according to an embodiment of the present invention.

Referring to FIGS. 1 and 17, during operation of imprint lithography system 10, template 26 is loaded onto template transfer system 40 at step 702. Template 26 is moved to a position beneath an imprint head 18 at step 704 and the spacing between the imprint head 18 and template 26 is reduced at step 706 to place the imprint head 18 in close proximity, or in contact, with the template 26. The template 26 is secured to the imprint head 18 at step 708, and the distance between template transfer holder 40a and imprint head 18 is increased at step 710. The template transfer holder 40a is moved to a second position that is not beneath the imprint head 18 at step 712. In a further embodiment, the template transfer holder 40a is removed from the motion stage 20 at step 714 and a process wafer 30 is loaded on a wafer chuck 21 of the motion stage 20 for imprinting with the template 26. Although the foregoing has been discussed with respect to template transfer system 40, it should be understood that the operation discussed with respect to FIG. 17 applies when using template transfer systems, 140, 240, 340, 440, 540 and 640, shown in FIGS. 11, 12, 13, 14, 15 and 16, respectively.

Figure 18:
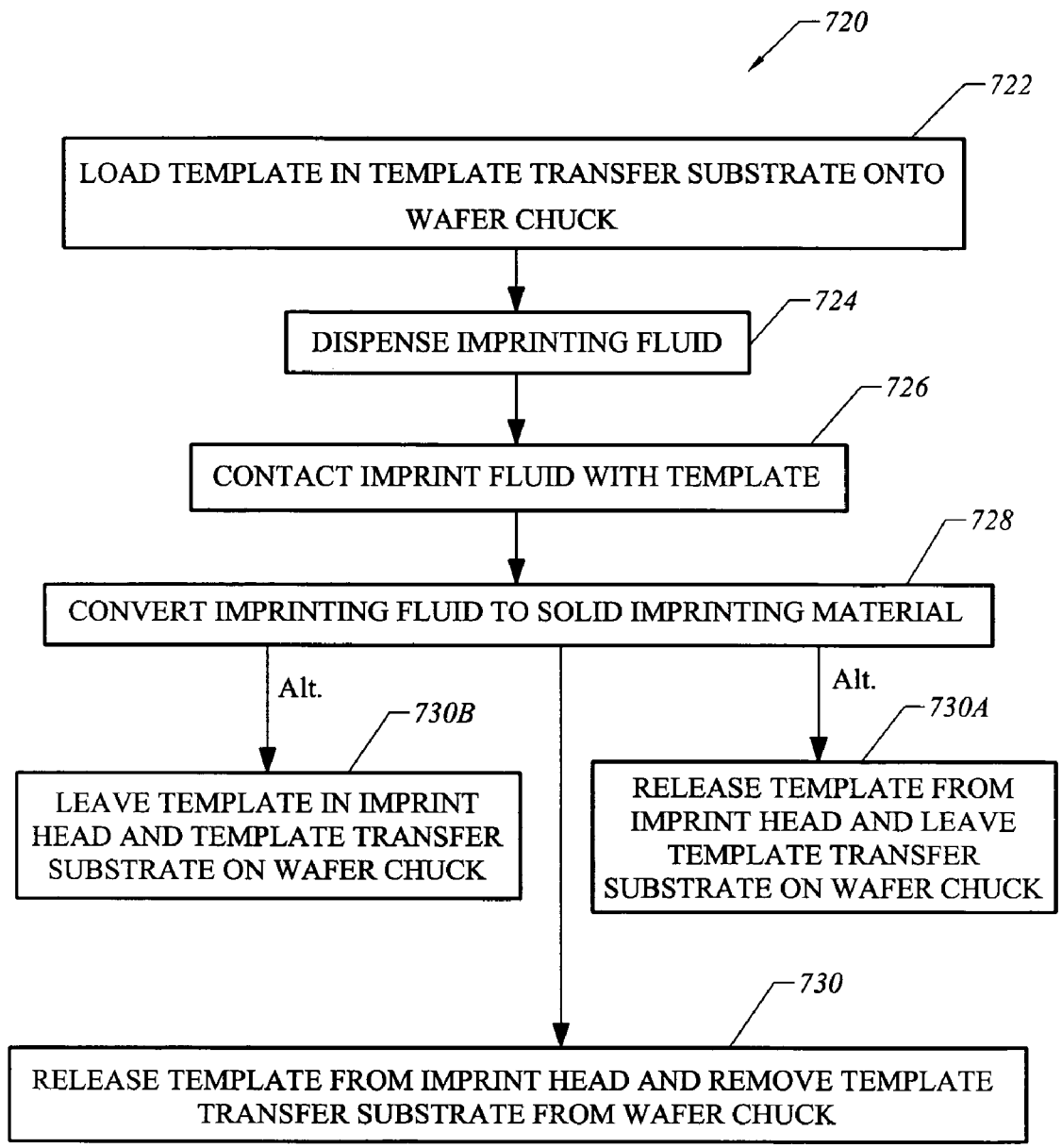
FIG. 18 is a simplified flow chart of a method of removing a template from an imprint head of a lithographic imprinting system, shown in FIG. 17, according to another embodiment of the present invention.

FIG. 18 is a simplified flow chart of a method 720 of removing a template 26, shown in FIG. 1, from an imprint head 18 in an imprint lithography system 10, according to another embodiment of the present invention. A template transfer substrate, such as template transfer substrates 144, 244, 344, 444, 544 and 644, shown in FIGS. 11, 12, 13, 14, 15 and 16, respectively, may be employed. For simplicity of discussion, the present example is discussed with respect to template transfer substrate 444, shown in FIG. 14, and applies with equal weight to the aforementioned template transfer substrates. At step 722, template transfer substrate 444 is loaded onto a wafer chuck 21 in imprint lithography system 10. A selected volume of imprinting fluid is dispensed onto the surface of the template transfer substrate 444 at step 724. Relative movement between the imprint head 18 holding a template 26 and the template transfer substrate 444 is achieved so that the template 26 contacts the imprinting fluid at step 726. The imprinting fluid is converted to solid imprint material at step 728. The template 26 is released from the imprint head 18 (e.g. by turning off the securing means and raising the imprint head 18) and the template transfer substrate 444 with the attached template 26 is removed from the wafer chuck 21 and transferred to a storage location at step 730. Alternatively, the template 26 remains attached to the template transfer substrate 444 on the wafer chuck 21 and the imprint head 18 and the template 26 are arranged to be spaced-apart at step 730a. In yet another alternative, the template 26 is left in the imprint head 18 attached to the template transfer substrate 444 for storage on the wafer chuck 21 at step 730b.

Figure 19:
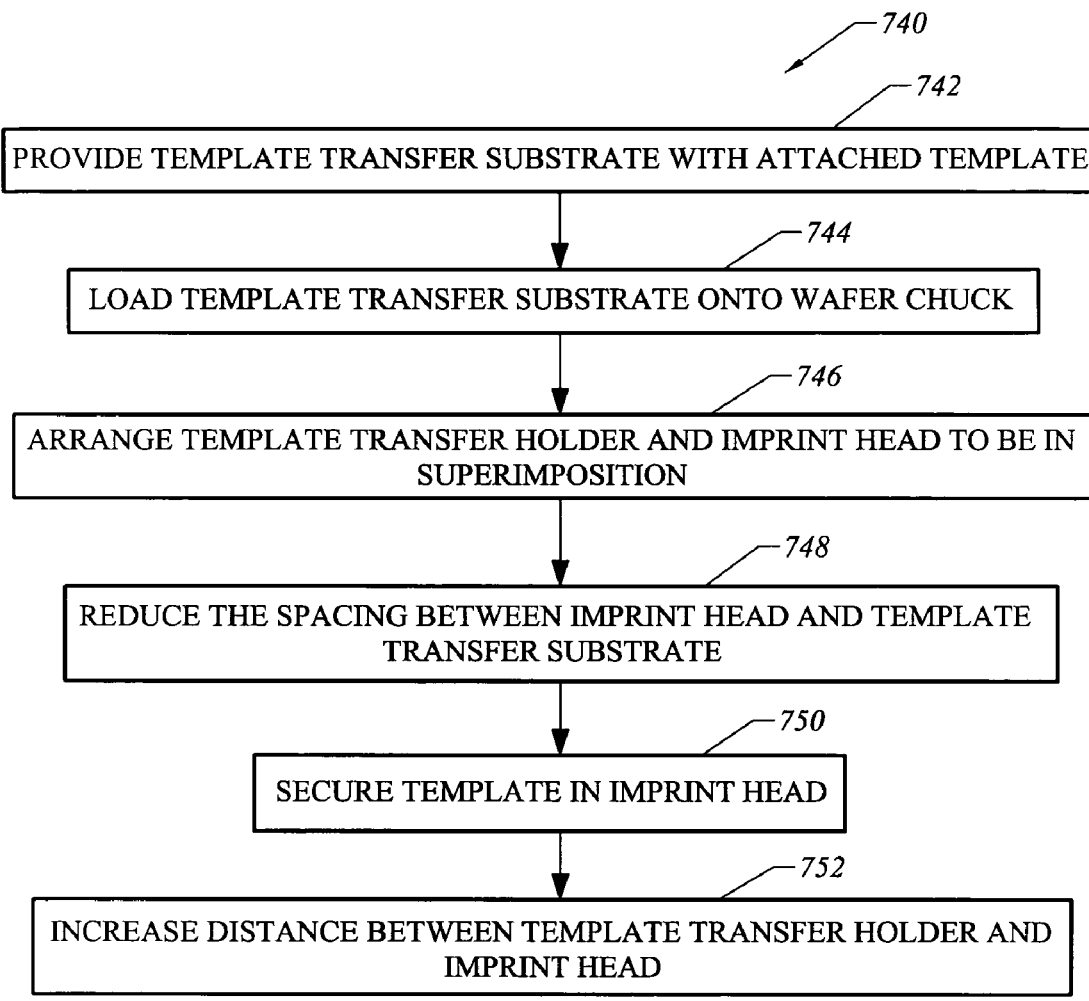
FIG. 19 is a simplified flow chart of a method of installing a template from a template transfer substrate into an imprint head of a lithographic imprinting system, shown in FIG. 17, according to yet another embodiment of the present invention.

FIG. 19 is a simplified flow chart of a method 740 of installing a template 26, shown in FIG. 1, from a template transfer substrate 444, shown in FIG. 14, into an imprint head 18 of an imprint lithography system 10, according to yet another embodiment of the present invention. A template transfer substrate 444 with a template 26 adhered to the template transfer substrate 444 with imprint material 434 is provided at step 742. The template transfer substrate 444 is loaded onto a wafer chuck 21 of a wafer 30 in imprint lithography system 10 at step 744. Alternatively, the template transfer substrate 444 is already on the wafer chuck 21, as when the template 26 is stored in this fashion between uses. The wafer chuck 21 is moved to position the template 26 beneath an imprint head 18 of the wafer 30 in imprint lithography system 10 at step 746. Alternatively, a template 26 stored on a template transfer substrate 444 is already beneath the imprint head 18. Relative movement between the imprint head 18 and the template 26 is achieved to place the imprint head 18 and template 26 in close proximity or contact at step 748. The template 26 is secured to the imprint head 18 at step 750. The distance between imprint head 18 and template transfer substrate 444 is increased at step 752, releasing the template 26 from the imprint material 434. The template transfer substrate 444 is removed from the wafer chuck 21 and a process wafer 30 may then be loaded onto the wafer chuck 21 for imprinting with the template 26.

The embodiments of the present invention described above are exemplary. Many changes and modifications may be made to the disclosure recited above, while remaining within the scope of the invention. Therefore, the scope of the invention should be determined not with reference to the above description, but instead should be determined with reference to the appended claims along with their full scope of equivalents.

What is claimed is:

1. A template transfer assembly comprising:
   a template transfer substrate;
   a template having first and second sides, with said first side facing away from said template transfer substrate and said second side facing said template transfer substrate and having a mold formed thereon; and
   polymerized imprint material disposed between said second side and said template transfer substrate to fixedly attach said template to said template transfer substrate.

2. The template transfer assembly as recited in claim 1 wherein said polymerized imprint material surrounds a sub-section of said mold.

3. The template transfer assembly as recited in claim 1 wherein said polymerized imprint material hermetically seals a sub-portion of said mold.

4. The template transfer assembly as recited in claim 1 wherein said polymerized imprint material surrounds said mold.

5. The template transfer assembly as recited in claim 1 wherein said polymerized imprint material encapsulates said mold hermetically sealing said mold from an ambient.

6. The template transfer assembly as recited in claim 1 wherein said template further includes a perimeter groove surrounding said mold with said polymerized imprint material disposed between said template transfer substrate and a region of said second side that is in superimposition with said perimeter groove.

7. The template transfer assembly as recited in claim 1 wherein said template transfer substrate comprises a semiconductor wafer.

8. The template transfer assembly as recited in claim 1 wherein said template transfer substrate includes a semiconductor wafer having an additional template coupled thereto.

9. A template transfer assembly comprising:
   a template transfer substrate;
   a template having first and second sides, with said first side facing away from said template transfer substrate and said second side facing said template transfer substrate and having a mold pattern formed thereon; and
   polymerized imprint material disposed between said second side and said template transfer substrate to fixedly attach said template to said template transfer substrate while maintaining a space between said mold and said template transfer substrate.

10. The template transfer assembly as recited in claim 9 wherein said space is filled with imprint material.

11. The template transfer assembly as recited in claim 9 wherein a sub-portion of said space defines a void between said substrate and a sub-section of said mold.

12. The template transfer assembly as recited in claim 11 wherein said polymerized imprint material surrounds said void.

13. The template transfer assembly as recited in claim 9 wherein said polymerized imprint material hermetically seals a sub-portion of said mold.

14. The template transfer assembly as recited in claim 11 wherein said void is coextensive with said mold.

15. The template transfer assembly as recited in claim 9 wherein said polymerized imprint material encapsulates said mold hermetically sealing said mold from an ambient.

16. A method of transferring an imprint lithography template, said method comprising:
    providing a template transfer substrate;
    forming a selected volume of imprinting fluid onto said template transfer substrate;
    placing said template upon said selected volume; and
    converting said imprinting fluid to solid imprint material, with said selected volume being a quantity sufficient to fixedly attach said template to said template transfer substrate while maintaining a space between a mold and said template transfer substrate.

17. The method as recited in claim 16 wherein converting further includes urging said template upon said selected volume so that, upon converting said imprint material, said solid imprint material surrounds a portion of said mold.

18. The method as recited in claim 10 wherein converting further includes urging said template upon said selected volume so that, upon converting said imprint material, said solid imprint material hermetically seals a sub-portion of said mold.

19. The method as recited in claim 10 wherein converting further includes urging said template upon said selected volume so that, upon converting said imprint material, said solid imprint material surrounds said mold, entirely.

20. The method as recited in claim 10 wherein converting further includes urging said template upon said selected volume so that, upon converting said imprint material, said solid imprint material encapsulates said mold, hermetically sealing said mold from an ambient.

\* \* \* \* \*